United States Patent [19]

Grundy

[11] 4,325,101
[45] Apr. 13, 1982

[54] VITAL ELECTRONIC TIME DELAY CIRCUIT

[75] Inventor: Reed H. Grundy, Murrysville, Pa.

[73] Assignee: American Standard Inc., Swissvale, Pa.

[21] Appl. No.: 106,971

[22] Filed: Dec. 26, 1979

[51] Int. Cl.³ .................... H01H 47/00; B61L 21/06
[52] U.S. Cl. .................... 361/195; 361/156; 361/198; 361/203; 246/63 C
[58] Field of Search ............... 361/156, 195, 196, 203, 361/198; 246/63 A, 63 C

[56] References Cited

U.S. PATENT DOCUMENTS

| | | | |
|---|---|---|---|
| 3,287,608 | 11/1966 | Pikrant. | |
| 3,407,340 | 10/1968 | Hufnagel. | |
| 3,694,702 | 9/1972 | Popp | 361/195 |
| 3,832,599 | 8/1974 | Grundy | 361/195 |
| 4,012,645 | 3/1977 | Moorey | 307/293 |
| 4,044,272 | 8/1977 | Darrow | 307/293 |
| 4,059,845 | 11/1977 | Kolkman | 361/198 |
| 4,150,417 | 4/1979 | Darrow et al. | 361/203 |

Primary Examiner—Patrick R. Salce
Assistant Examiner—L. C. Schroeder
Attorney, Agent, or Firm—J. B. Sotak

[57] ABSTRACT

A fail-safe electronic time delay circuit for providing a predetermined time delay period having an emitter-follower amplifier connectable to a source of recurrent signals, a voltage doubling rectifier for rectifying the amplified recurrent signals and for charging a capacitor which powers a tickler coil transistor oscillator, a pair of complementary switching transistors which are alternately rendered conductive by the a.c. oscillations of the transistor oscillator, a rectifier having a capacitor which is charged when one of the pair of complementary switching transistors is conductive and which is discharged through a vital relay when the other of the pair of complementary switching transistors is rendered conductive.

10 Claims, 1 Drawing Figure

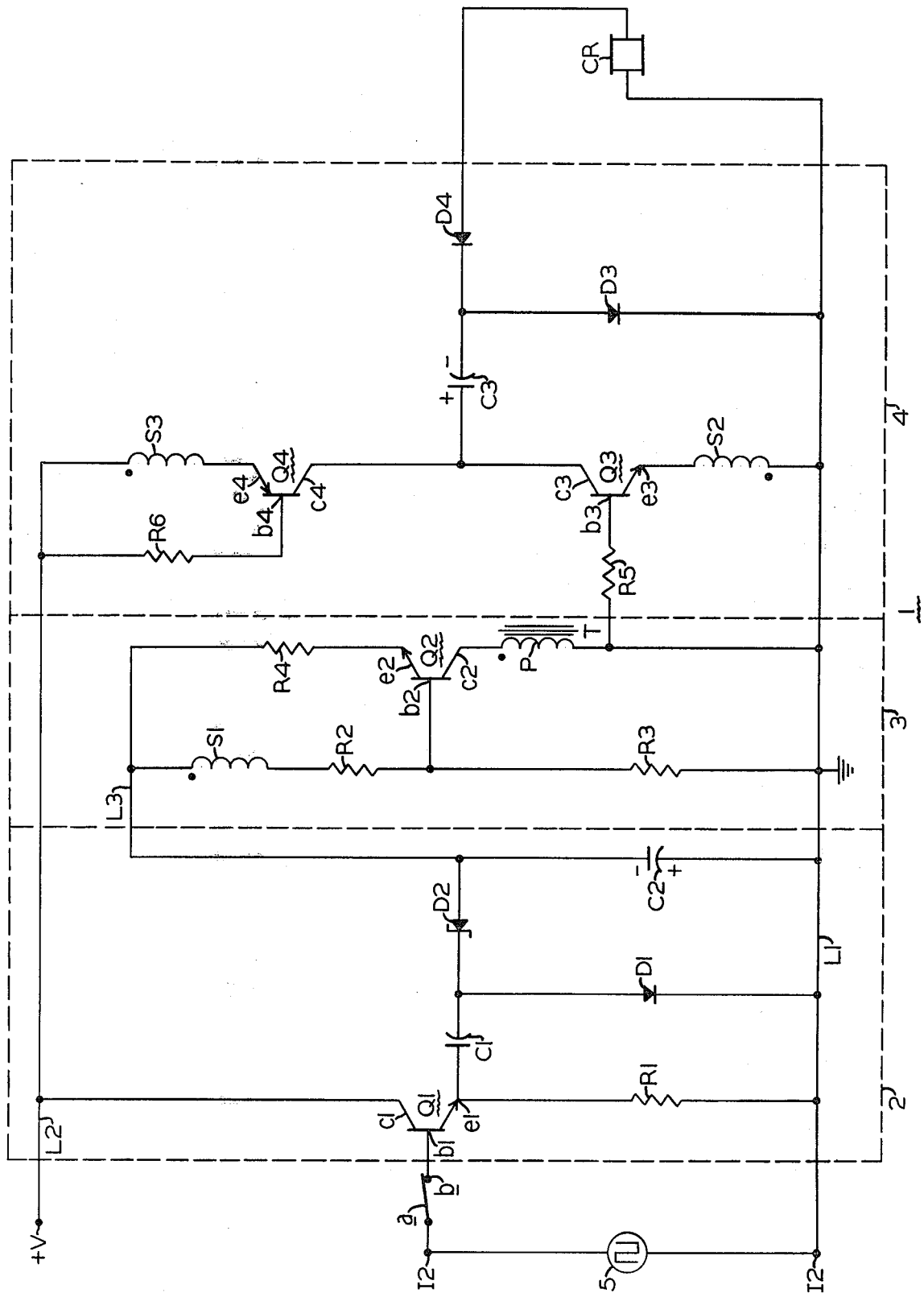

VITAL ELECTRONIC TIME DELAY CIRCUIT

FIELD OF THE INVENTION

This invention relates to a fail-safe electronic timing circuit and, more particularly, to a vital-type of solid-state time delay circuit having an amplifier for supplying a.c. signals to a rectifier which charges a capacitor for powering a tickler coil oscillator which alternately renders a pair of complementary switching amplifiers conductive for causing a capacitor diode network to normally energize a vital relay and for causing the vital relay to become de-energized a predetermined time interval after removal of the a.c. signals.

BACKGROUND OF THE INVENTION

In various types of vital control systems, such as, in cab signaling apparatus for railroad and mass and/or rapid transit operations, it is extremely important to utilize the utmost care in designing and laying out electrical circuits or networks. It will be appreciated that in order to provide the highest degree of safety to individuals and also to afford the greatest amount of protection to the equipment, it is necessary to ensure that under no circumstance will a critical component or circuit failure be capable of producing an unsafe condition. Therefore, it is mandatory that the control apparatus must operate in a fail-safe manner so that any conceivable failure will result in a condition at least as restrictive and preferably more restrictive than that preceding the failure. For example, a circuit malfunction or a component failure in a vital speed control system must not be permitted to simulate or indicate a condition for causing an increase in the speed of a vehicle. A vital piece of apparatus or equipment is considered to operate in a fail-safe manner when any critical component or circuit failure results in a safe condition according to the definition of the Association of American Railroads (AAR).

In a cab signal speed control system, it is imperative that a motorman or operator must take appropriate action within a given period of time after a more restrictive speed command is received on board from the wayside. That is, after receiving a more restrictive or lower speed signal, the operator must immediately acknowledge the speed reduction command by decelerating the moving train to the newly received prescribed speed or the emergency brakes will be set after elapse of the given period of time. It will be understood that the acknowledgment of the speed reduction and initiation of the vehicle deceleration should take place as soon as possible after reception of the more restrictive signal in order to prevent the train from going too fast and too far beyond a safe braking and stopping point. It will be appreciated that the given period of time from the reception of the more restrictive signal to the acknowledgment by the operator must not be capable of being lengthened or increased due to a component or circuit failure. Previously, a capacitor was employed for the given period of time before actuation of the emergency brakes. However, the amount of potential charge required for holding the vital relay energized was relatively large which necessitated an extremely large capacitor which is bulky and costly. In addition, it is beneficial from a size and weight standpoint to attempt to use a capacitor of a small value in place of an extremely large one to provide the necessary time delay. However, as mentioned above, the time delay circuit must operate in a fail-safe manner in that no critical component or circuit failure is capable of extending the expiration of the time period to produce an unsafe condition.

OBJECTS OF THE INVENTION

Accordingly, it is an object of this invention to provide a new and improved timing circuit.

Another object of this invention is to provide a vital electronic time delay circuit having a given time period which cannot be increased due to a component or circuit failure.

A further object of this invention is to provide a fail-safe timing circuit having a time delay during which is incapable of being lengthened by a short circuit or open circuit condition.

Yet another object of this invention is to provide a unique solid-state timer which operates in a fail-safe manner.

Yet a further object of this invention is to provide a novel fail-safe electronic time delay circuit which ensures that the duration of the time delay period is not unsafely lengthened by a component or circuit failure.

Still another object of this invention is to provide a unique vital-type of transistorized time delay circuit in which any failure is incapable of increasing the length of the time delay period.

Still a further object of this invention is to provide a fail-safe timing circuit including a source of periodic signals, an input amplifier for amplifying the periodic signals, a rectifier for rectifying the amplified periodic signals and for charging a potential storage means, an oscillator powered by the potential charge on the storage means for producing a.c. oscillations, a pair of switching transistors alternately rendered conductive by opposite alternations of the a.c. oscillations, a capacitor-diode network coupled to the pair of switching transistors for normally causing the energization of a vital relay and for causing the de-energization of the vital relay a predetermined time after the source of periodic signals is disconnected from the circuit.

An additional object of this invention is to provide a vital timer which is economical in cost, unique in design, efficient in operation, durable in service, dependable in use, and simple in construction.

SUMMARY OF THE INVENTION

In accordance with the present invention, there is provided a vital electronic time delay circuit including an emitter-follower transistor amplifying stage connectable to a source of square-wave signals when a switch is closed. A voltage doubler network includes a series charging capacitor, a pair of diode rectifiers, and a doubler charging capacitor for rectifying the amplified square-wave signals to produce a d.c. voltage which charges the doubler charging capacitor. The potential charge on the doubler charging capacitor powers a tickler coil transistor oscillator for producing a.c. oscillations which are transformer coupled to a pair of complementary switching transistors. The complementary switching transistors are alternately rendered conductive by opposite alternations of the a.c. oscillations which provide emitter driving current. A rectifier network including a storage capacitor and a pair of diode rectifiers coupled to the pair of switching transistors for causing the charging of the storage capacitor when one of the pair of complementary switching transistors conducts and for causing the discharge of the storage capacitor through a vital relay coil. Thus, the vital relay remains energized while the switch is closed and becomes de-energized a predetermined time interval after the switch is opened.

DESCRIPTION OF THE DRAWINGS

The single FIGURE is a schematic circuit diagram illustrating a preferred embodiment of a fail-safe electronic time delay circuit of the present invention.

DETAILED DESCRIPTION OF THE INVENTION

Referring now to the single FIGURE of the drawing, there is shown a vital-type of solid-state timer or electronic time delay circuit which is generally characterized by numeral 1. As shown, the fail-safe timing circuit 1 includes an input amplifier-rectifier 2, an oscillator 3, and an output amplifier-rectifier 4.

It will be seen that an a.c. voltage or square-wave signal source 5 is connected between upper input terminal I1 and lower input terminal I2. The lower input terminal I2 is connected to a reference or ground potential by a common lead L1. The upper input terminal I1 is connected to the input of the amplifier-rectifier 2 via switch contacts a and b. The movable contact a is cooperatively associated with the stationary contact b to selectively open and close the circuit from the periodic or square-wave voltage source 5 to the input of the amplifier-rectifier circuit 2. The switch contacts a and b are normally operated by the speed command decoding relay unit which forms part of the cab signaling and speed control equipment carried on board the train or mass and/or rapid transit vehicle. In practice, the movable contact a is connected to the armature of the decoding relay which remains de-energized so long as a more restrictive speed command signal is not picked up from the wayside signaling equipment.

As mentioned above, the stationary terminal b is connected to the input of circuit 2 which includes an amplifying stage and a rectifying network. The amplifier includes an NPN transistor Q1 which is connected in an emitter-follower configuration. The amplifying transistor Q1 includes a base electrode b1, a collector electrode c1, and an emitter electrode e1. As shown, the base electrode b1 is directly connected to stationary contact b while the collector electrode c1 is directly connected to a suitable power supply source in the form of a positive d.c. potential +V via lead L2. The emitter electrode e1 is connected to the ground lead L1 via load resistor R1. The amplified a.c. signals developed on emitter electrode e1 are fed to the rectifier network which includes a series charging capacitor C1, a pair of diode rectifiers D1 and D2, and a doubler charging capacitor C2. The rectifier functions as a regulated voltage doubling network in that the value of potential charge developed across charging capacitor C2 is substantially equal to the magnitude of the amplified a.c. or square-wave signals appearing on emitter electrode e1. As shown, one plate of capacitor C1 is connected to the emitter electrode e1 while the other plate of capacitor C1 is connected to the junction point of diodes D1 and D2. The cathode of diode D1 is directly connected to ground lead L1 while its anode is connected to the cathode of zener diode D2. The anode of zener diode D2 is connected to one plate of doubler charging capacitor C2 while the other plate of capacitor C2 is directly connected to ground lead L2. Thus, it will be appreciated that the voltage doubler rectifies the a.c. signals obtained from the input amplifier into a suitable regulated negative voltage (as shown) for powering the oscillator 3. That is, the d.c. voltage developed across capacitor C2 is maintained constant by the zener diode D2.

The oscillating circuit 3 takes the form of a tickler coil oscillator which includes an NPN transistor Q2 having a base electrode b2, a collector electrode c2, and an emitter electrode e2. It will be noted that the biasing and operating potential for the transistor Q2 is supplied by charging capacitor C2. As shown, a voltage divider including resistors R2 and R3 provides base biasing potential for transistor Q2. The base electrode b2 is connected to the junction point between resistors R2 and R3. The upper end of resistor R2 is connected to the negative voltage lead L3 via tickler or secondary winding S1 of a transformer T while the lower end of resistor R3 is connected to ground lead L1. The emitter electrode e2 is connected to negative supply lead L3 via resistor R4 while the collector electrode c2 is connected to ground lead L1 via the primary winding P of transformer T.

It will be noted that a.c. signals developed in primary winding P not only cause regenerative feedback voltage signals to be induced in tickler coil S1 for oscillator 3 but also cause current signals to be induced in secondary windings S2 and S3 of transformer T. The secondary windings S2 and S3 are coupled to a pair of complementary transistors Q3 and Q4 of the output amplifier-rectifier circuit 4. As shown, the NPN transistor Q3 includes a base electrode b3, a collector electrode c3, and an emitter electrode e3 while the PNP transistor Q4 includes a base electrode b4, a collector electrode c4, and an emitter electrode e4. The base electrode b3 is connected by biasing resistor R5 to ground. The emitter electrode e3 is connected to ground lead L1 via secondary winding S2. The base electrode b4 is connected by biasing resistor R6 to the positive voltage supply lead L2 while the emitter electrode is connected to lead L3 via secondary winding S3. The collector electrodes c3 and c4 are connected in common and form the output terminal of the switching amplifier. The rectifying network of circuit 4 includes a charging capacitor C3 and a pair of diodes D3 and D4. It will be seen that one plate of capacitor C3 is connected to the junction point formed between emitter electrodes e3 and e4 while the other plate of capacitor C3 is connected to the junction point of diodes D3 and D4. The anode of diode D3 is connected to the cathode of diode D4 while the cathode of diode D3 is connected to ground lead L1. The anode of diode D4 is connected to one end of the coil CR of a vital-type of polar biased electromagnetic relay. The other end of the relay coil CR is connected to ground lead L1.

Turning now to the operation of the time delay circuit 1, let us assume that the circuit is intact and operating properly and that the train or vehicle is moving along its route of travel at a speed in accordance with the last received speed command signal. Under this assumed condition, the switch contacts a and b are closed by the decoding unit so that the square-wave signal source 5 is applied to the input of amplifying transistor Q1. It will be seen that during the maximum value of the amplifier square-wave signals, the capacitor C1 is charged through diode D1 to the ground lead L1. Conversely, during the minimum value of the square waves, a discharge path is established for capacitor C1 through resistor R1, through ground lead L1, to capacitor C2, and through zener diode D2 so that a negative potential having a constant value substantially equal to the magnitude of the square-wave signals appears on the upper plate of capacitor C2. Thus, the potential charge on capacitor C2 powers the transistor oscillator 3 so that the circuit goes into oscillation. It will be appreciated that a portion of the output of the oscillating circuit 3 is fed back through the transformer coupled inphase tickler coil S1 to sustain the production of a.c. oscillating signals so long as the capacitor C2 remains charged. Further, a.c. output signals are transformer coupled to the out-of-phase secondary winding S2 and to the in-phase secondary winding S3 to alternately render the transistors Q3 and Q4 conductive and nonconductive. Let us assume that secondary winding S3 supplies sufficient emitter current to render transistor Q4 conductive while transistor Q3 is nonconductive due to the insufficient emitter current. Under this condition, a charging path is established for capacitor C3 from the terminal $+V$, through lead L2, through winding S3, through the emitter-collector of transistor Q4, through capacitor C3 and through diode D3 to ground lead L1. Thus, capacitor C3 becomes charged during one alternation of the a.c. oscillating signal of the oscillator circuit 3. During the other alternation of the a.c. oscillating signal, the secondary winding S3 provides emitter current for transistor Q3 so that this semiconductive element is rendered conductive while the transistor Q4 is switched off. The turning on of the transistor Q3 causes a discharge to be established from the left-hand plate of capacitor C3, through collector-emitter electrodes of transistor Q3, through lead L1, through relay coil CR, through diode D4 to the right-hand plate of capacitor C3. Thus, the vital relay is energized by the discharge current passing through coil CR. Now, when the transistor Q4 is switched on and the transistor Q3 is turned off on the next opposite alternation, the capacitor C3 is again charged through the previously described charging path. Further, the relay remains picked up by the collapsing magnetic field of coil CR which induces a voltage and causes a momentary current to flow through diodes D3 and D4 until transistor Q3 is again rendered conductive to cause capacitor C3 to discharge through coil CR. It will be appreciated that the vital relay CR will remain energized so long as the circuit is functioning properly and as long as the square-wave signal source 5 is applied to the input of circuit 1.

Now assuming that the train or mass and/or rapid transit vehicle is proceeding along its route of travel and that a more restrictive speed command signal is received on board to reduce speed. Under this condition, the speed command decoding unit and an appropriate relay effectively actuate an alarm for alerting the trainman or operator that he has a limited amount of time to take appropriate action to reduce the speed or emergency braking action will be automatically instituted to bring the train to a complete stop. At the same time that the alarm is initiated, the switch contacts a and b are opened so that the source of square-wave signals is removed from the input of circuit 1. The absence of the square-wave input signals causes the capacitor C2 to begin to discharge through winding S1, resistor R2, and resistor R3. The rate of discharge is dependent upon the time constant which is a function of resistance and capacitance. After a predetermined period of time or given time interval, the potential charge across capacitor C2 will decay to a voltage value which will no longer power the oscillating circuit 3. The cessation of the a.c. oscillations results in the discontinuance of the charging of capacitor C3 which causes the de-energization of the relay coil CR. When the vital relay releases, the moving train or vehicle is placed into automatic braking, emergency braking, or service braking, to bring the train or vehicle to a full and complete stop. Thus, the operator must acknowledge receipt of the more restrictive speed command signal within the predetermined time interval established by the time delay circuit 1 by manually closing switch contacts a and b or the moving train will be automatically stopped.

As previously noted, it is mandatory that under no circumstance should the predetermined time delay interval be capable of being extended or increased due to a malfunction. That is, the present time delay circuit must operate in a fail-safe manner in order to ensure that a component or circuit failure will not result in an unsafe condition. The opening or shorting of the transistors, resistors, or windings destroys the a.c. amplifying characteristics or the d.c. biasing requirements of the amplifying, oscillating, or switching transistors Q1, Q2, Q3, and Q4. The critical resistors are constructed of a special carbon composition so that these resistive elements are incapable of becoming short-circuited. The voltage rectifiers are inherently fail-safe. Further, it will be noted that the plurality of the energizing voltage across the capacitor is opposite to that of the d.c. voltage supply source so that the polarized relay CR is incapable of being energized by the supply voltage. Thus, it is apparent that the presently described electronic time delay circuit operates in a fail-safe fashion in that no critical component or circuit failure is capable of lengthening the originally established time period or interval of the circuit 1.

It will be understood that various alterations and changes may be made by those skilled in the art without departing from the spirit and scope of this invention. For example, opposite types of transistors may be used from those shown and described simply by reversing the polarity of d.c. supply voltage and the diodes. The type and number of amplifying, oscillating, and switching stages may be varied dependent upon the load demands and the like. Moreover, it is apparent that other modifications and ramifications may be made to the presently described invention and, therefore, it is understood that all variations, alterations, changes, and equivalents falling within the spirit and scope of the subject invention are herein meant to be included in the appended claims.

Having thus described my invention, what I claim as new and desire to secure by Letters Patent, is:

1. A vital electronic time delay circuit comprising, a source of periodic signals, a switch connected between said source of periodic signals and an input amplifier, said input amplifier amplifies said periodic input signals when said switch is closed, a rectifier for rectifying the amplified periodic input signals and for charging a potential storage means, an oscillator powered by the potential charge on said storage means for producing a.c. oscillations, a pair of switching transistors alternately rendered conductive by opposite alternations of said a.c. oscillations, a capacitor-diode network coupled to said pair of switching transistors for normally causing the energization of a vital relay and for causing the de-energization of said vital relay a predetermined period of time after the source of the periodic signals is disconnected from the circuit by the opening of said switch.

2. The vital electronic time delay circuit as defined in claim 1, wherein said input amplifier is a single stage transistor amplifier.

3. The vital electronic time delay circuit as defined in claim 2, wherein said transistor amplifier takes the form of an emitter-follower configuration.

4. The vital electronic time delay circuit as defined in claim 1, wherein said rectifier is a voltage doubler network.

5. The vital electronic time delay circuit as defined in claim 4, wherein said voltage doubler network includes a series charging capacitor, a pair of diodes, and a doubler charging capacitor.

6. The vital electronic time delay circuit as defined in claim 5, wherein said oscillator takes the form of a transistorized tickler coil oscillating circuit having said a.c. oscillations transformer coupled to said pair of switching transistors.

7. The vital electronic time delay circuit as defined in claim 1, wherein said pair of switching transistors includes an NPN and a PNP transistor.

8. The vital electronic time delay circuit as defined in claim 1, wherein said capacitor-diode network includes a series charging capacitor and a pair of diodes.

9. The vital electronic time delay circuit as defined in claim 8, wherein said series charging capacitor is charged when one of said pair of switching transistors is conductive and is discharged when the other of said pair of switching transistors is conductive to energize said vital relay.

10. A fail-safe timing circuit comprising, an emitter-follower amplifier connectable to a source of square-wave signals, a voltage doubling rectifier coupled to said emitter-follower amplifier, said voltage doubling rectifier having a capacitor which is charged by the rectified voltage, a tickler coil transistor oscillator which is powered by the voltage charge to produce a.c. oscillations, a pair of complementary switching transistors alternately rendered conductive by the respective positive and negative excursions of the a.c. oscillations, a rectifier network having a capacitor which is charged when one of said complementary switching transistors is rendered conductive and which is discharged through a load when the other of said pair of complementary switching transistors is rendered conductive.

* * * * *